US010284224B2

(12) United States Patent
Pamula

(10) Patent No.: US 10,284,224 B2
(45) Date of Patent: May 7, 2019

(54) SYSTEM AND METHOD FOR COMPRESSED SENSING

(71) Applicants: IMEC VZW, Leuven (BE); Katholieke Universiteit Leuven, KU LEUVEN R&D, Leuven (BE)

(72) Inventor: Venkata Rajesh Pamula, Bangalore (IN)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 296 days.

(21) Appl. No.: 14/886,537

(22) Filed: Oct. 19, 2015

(65) Prior Publication Data

US 2016/0112063 A1 Apr. 21, 2016

(30) Foreign Application Priority Data

Oct. 21, 2014 (EP) ..................................... 14189794
Feb. 12, 2015 (EP) ..................................... 15154815

(51) Int. Cl.
*H03M 7/30* (2006.01)
(52) U.S. Cl.
CPC ....... *H03M 7/3059* (2013.01); *H03M 7/3062* (2013.01)
(58) Field of Classification Search
None
See application file for complete search history.

(56) References Cited

U.S. PATENT DOCUMENTS

| 2012/0005248 A1* | 1/2012 | Garudadri ............... H03M 7/30 708/207 |
| 2013/0002715 A1* | 1/2013 | Tidman .................. H04N 19/97 345/629 |
| 2013/0128042 A1 | 5/2013 | Bridge et al. |

OTHER PUBLICATIONS

Dixon, Anna M.R. et al., "Compressed Sensing System Considerations for ECG and EMG Wireless Biosensors", IEEE Transactions on Biomedical Circuit and Systems, vol. 6, No. 2, Apr. 2012, pp. 156-166.

(Continued)

*Primary Examiner* — Herve-Louis Y Assouman
(74) *Attorney, Agent, or Firm* — McDonnell Boehnen Hulbert & Berghoff LLP

(57) ABSTRACT

A system for compressed sensing comprising: a compressive sampling module configured for providing a CS-sampled signal and a signal reconstruction module configured for receiving and allocating a first plurality of measurement windows comprising a number of samples from the CS-sampled signal, calculating a corresponding first plurality of reconstruction windows based on the first plurality of measurement windows and calculating a first version of a reconstructed signal based on the first plurality of reconstruction windows. The signal reconstruction module is also configured to allocate a second plurality measurement windows overlapping in content with the first plurality of measurement windows, calculate a second plurality of reconstruction windows based on the second plurality of measurement windows, calculate a second version of the reconstructed signal based on the second plurality of reconstructed windows and generate a reconstructed signal based on values from the first version and the second version of the reconstructed signal.

20 Claims, 7 Drawing Sheets

(56) References Cited

OTHER PUBLICATIONS

Baheti et al., "An ultra low power pulse oximeter sensor based on compressed sensing", Sixth International Workshop on Wearable and Implantable Body Sensor Networks, pp. 144-148, Jun. 2009.
Candès et al., "An Introduction to compressive sampling", IEEE Signal Processing Magazine, vol. 25, pp. 21-30, Mar. 2008.
Extended European Search Report for related European Patent Application No. 15154815.3, dated Aug. 3, 2015.
Tan et al., "A Novel and Efficient Mixed-Signal Compressed Sensing for Wide-Band Cognitive Radio", IFOST 2010 Proceedings, IEEE Oct. 13, 2010, pp. 27-32.

* cited by examiner

Figure 8

| Algorithm | Window Size | CPU Time, s | SNDR dB ||
|---|---|---|---|---|
| | | | Average | Overlapped |
| Traditional | 512 | 1.31 | 17.07 | 15.26 |
| Traditional | 1024 | 6.92 | 17.85 | 22.08 |
| Overlapped Window | 512 | 2.91 | 17.75 | 21.97 |

SYSTEM AND METHOD FOR COMPRESSED SENSING

CROSS-REFERENCE TO RELATED APPLICATIONS

This application claims priority to European Patent Application Serial No. 14189794.2 filed Oct. 21, 2014 and European Patent Application Serial No. 15154815.3 filed Feb. 12, 2015, the contents of each of which are hereby incorporated by reference in their entirety.

FIELD

The present description relates generally to signal acquisition systems and more specifically to systems and methods for compressed sensing.

BACKGROUND

Compressed sensing or compressive sampling (CS) is an emerging signal processing technique that asserts that certain signals can be recovered faithfully from far fewer number of samples or measurements. CS relies on the underlying structure of the signal which is expressed in terms of its 'sparsity' and the 'incoherence' which is related to the sampling scheme (see for example "*An Introduction to compressive sampling*", E. J. Candès et al., IEEE Signal Processing Magazine, vol. 25, pp 21-30, March 2008).

Known state-of-the-art biosignal acquisition systems using, for example, the techniques described in "*Compressed Sensing System Considerations for ECG and EMG Wireless Biosensors*", A. M. R. Dixon et al., IEEE Transactions on Biomedical Circuits and Systems, vol. 6, No. 2, April 2012, require, for the reconstruction of an approximation of the original sampled signals, long reconstruction windows of samples N to induce sufficient signal sparsity and optimize reconstruction quality (reduce reconstruction error). On the other hand, the processing of long reconstruction windows of samples N increases latency and requires significant computational complexity, e.g. up to $O(N^3)$, since the computational complexity of the reconstruction depends on the reconstruction window sample size N, which makes current techniques inadequate for embedded applications.

Therefore, there exists a link between the CS reconstruction window sample length, signal reconstruction quality, and processing complexity. This trade-off is also apparent from the paper "*An ultra low power pulse oximeter sensor based on compressed sensing*", P. K. Baheti et al., Body Sensor Networks 2009, pp 144-148, Berkeley, USA 2009.

Improvements to current state of the art compressed sensing systems and methods are therefore desired.

SUMMARY

According to one aspect of the present description, a new and improved method and system for compressed sensing is provided.

According to an example embodiment, the system and method for compressed sensing advantageously improves the accuracy or quality of the reconstruction of the original sampled signal for a predefined reconstruction window sample size, therefore improving the trade-off between the reconstruction window sample size and the signal reconstruction accuracy. According to an example embodiment, the system and method for compressed sensing advantageously improves the signal reconstruction accuracy using shorter reconstruction window sizes.

According to an example embodiment, the system and method for compressed sensing advantageously reduces signal reconstruction latency for a predefined reconstruction window sample size, therefore improving the trade-off between the reconstruction window sample size and signal reconstruction latency. According to an example embodiment, the system and method for compressed sensing advantageously achieves signal reconstruction accuracy comparable to that achieved by state of the art techniques using longer reconstruction window sizes, but at decreased latency.

According to an example embodiment, the system and method for compressed sensing advantageously reduces signal reconstruction processing complexity for achieving a predefined signal reconstruction accuracy, therefore improving the trade-off between signal reconstruction complexity and signal reconstruction accuracy. According to an example embodiment, the system and method for compressed sensing advantageously provides increased reconstruction quality without significantly increasing computational complexity.

According to an example embodiment, there is provided a system for compressed sensing comprising: a compressive sampling module configured for providing a CS-sampled signal; and a signal reconstruction module configured for receiving and allocating a first plurality of measurement windows comprising a number of samples from the CS-sampled signal, calculating a corresponding first plurality of reconstruction windows based on said first plurality of measurement windows and calculating a first version of a reconstructed signal based on said first plurality of reconstruction windows; and further configured to allocate a second plurality measurement windows overlapping in content with said first plurality of measurement windows, calculate a second plurality of reconstruction windows based on said second plurality of measurement windows, calculate a second version of the reconstructed signal based on said second plurality of reconstructed windows and generate a reconstructed signal based on values from said first version and said second version of the reconstructed signal.

According to an example embodiment, the segment values taken from the second version of the reconstructed signal are segment values corresponding to a window boundary of the first plurality of reconstruction windows.

According to an example embodiment, the signal reconstruction module is configured for iteratively calculating a first segment from the first version of the reconstructed signal and then a subsequent segment from the second version of the reconstructed signal and for substituting values from the first segment into the subsequent segment or vice versa.

According to an example embodiment, the signal reconstruction module is configured for retaining N/2 sample values from the previously reconstructed signal segment and replacing the first N/4 sample values of the current reconstructed signal segment with the corresponding values from the previously reconstructed signal segment.

According to an example embodiment, the linear transform used for calculating said first and second version of the reconstructed signal is a discrete cosine transform.

According to an example embodiment, the system and method for compressed sensing is advantageously used for low power and efficient acquisition, processing and/or monitoring of biosignals such as, for example electrocardiogram (ECG), electroencephalogram (EEG), electromyogram (EMG) and/or photoplethysmogram (PPG) signals.

According to an example embodiment, the proposed method for compressed sensing advantageously improves reconstruction accuracy for shorter reconstruction windows. According to an embodiment, the proposed method for compressed sensing is able to achieve higher reconstruction accuracy for shorter window sizes compared to traditional state of the art approaches.

According to an example embodiment, the proposed method for compressed sensing advantageously eliminates reconstruction artifacts at the boundaries of the reconstruction windows, which are inherent to the traditional signal reconstruction approaches.

The description also relates to an electronic device comprising a system for compressed sensing according to embodiments herein described.

Further, the description also relates to a method for reconstructing a signal in a compressed sensing system, the method comprising: receiving and allocating a first plurality of measurement windows comprising a number of samples from a CS-sampled signal; calculating a corresponding first plurality of reconstruction windows based on said first plurality of measurement windows; calculating a first version of a reconstructed signal based on said first plurality of reconstruction windows; allocating a second plurality measurement windows overlapping in content with said first plurality of measurement windows; calculating a second plurality of reconstruction windows based on said second plurality of measurement windows; calculating a second version of the reconstructed signal based on said second plurality of reconstructed windows; and generating the reconstructed signal based on values from said first version and said second version of the reconstructed signal.

According to an example embodiment, allocating the second plurality measurement windows overlapping in content with said first plurality of measurement windows comprises sliding the measurement windows of the second plurality to a position in which there are samples from two measurement windows of the first plurality.

The description also relates to a computer program product comprising computer program code means adapted to calculate a reconstructed signal in a compressed sensing system, according to embodiments of the method herein described, when said program is run on a computer.

Further, the description relates to a computer readable storage medium comprising the herein described computer program calculating a reconstructed signal in a compressed sensing system.

BRIEF DESCRIPTION OF THE FIGURES

The above and other aspects of the system according to the present description will be shown and explained with reference to the non-restrictive example embodiments described hereinafter.

FIG. 8 shows a comparison table of the CPU time required for the reconstruction of the original CS-sampled signal and the Signal to Noise and Distortion ratio (SNDR) indicating the quality of the original CS-sampled signal reconstruction for a compression ratio of 10 and different reconstruction window sizes, between a state of the art reconstruction algorithm and an example reconstruction algorithm implementing one of the methods according to the present description.

DETAILED DESCRIPTION

In the following, in the description of example embodiments, various features may be grouped together in a single embodiment, figure, or description thereof for the purpose of streamlining the disclosure and aiding in the understanding of one or more of the various inventive aspects. This is, however, not to be interpreted as the solution requiring more features than the ones expressly recited in the claims. Furthermore, combinations of features of different embodiments are meant to be within the scope of the present disclosure, as would be clearly understood by those skilled in the art. Additionally, in other instances, well-known methods, structures and techniques have not been shown in detail in order not to obscure the conciseness of the description.

Figure 1:
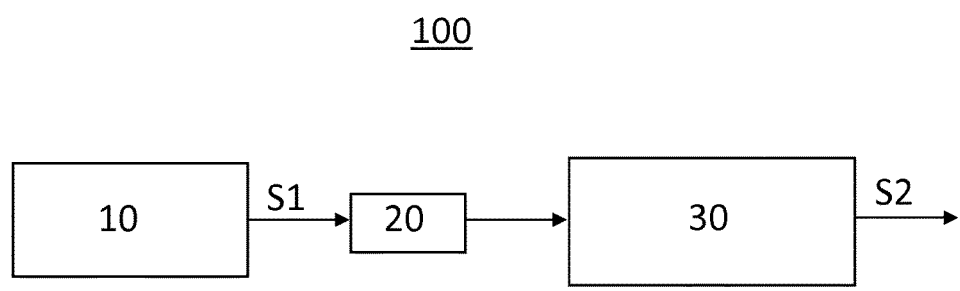
FIG. 1 shows a general block diagram of an example system for compressed sensing.

FIG. 1 shows a general block diagram of an example system for compressed sensing 100 comprising a compressive sampling module 10 providing a CS-sampled signal S1, a signal conditioning module 20, and a signal reconstruction module 30 providing a reconstructed signal S2. The compressive sampling module 10 may include a sensor that generates an analogue version of a certain sensed signal and said signal may be sampled according to current state of the art CS techniques (below Nyquist sampling rate) so that a CS-sampled version S1 of the sensed signal is provided to the next signal conditioning, transmission and/or reconstruction stages. Alternatively, the compressive sampling module 10 may trigger or activate a sensor according to current state of the art CS techniques (below Nyquist sampling rate) so that said sensor directly generates a CS-sampled version S1 of the sensed signal. The signal conditioning module 20 may comprise an analogue to digital converter and/or any other element for conditioning of the CS-sampled signal S1 to a transmission means. The signal reconstruction module 30 is adapted to receive information concerning the CS-sampled signal S1 and process said CS samples in order to generate a reconstructed signal S2, which may be an approximation of the original sensed analogue signal. According to example embodiments, the system for compressed sensing 100 may be an ECG, EEG, EMG or a Pulseoxymeter system.

Figure 2:
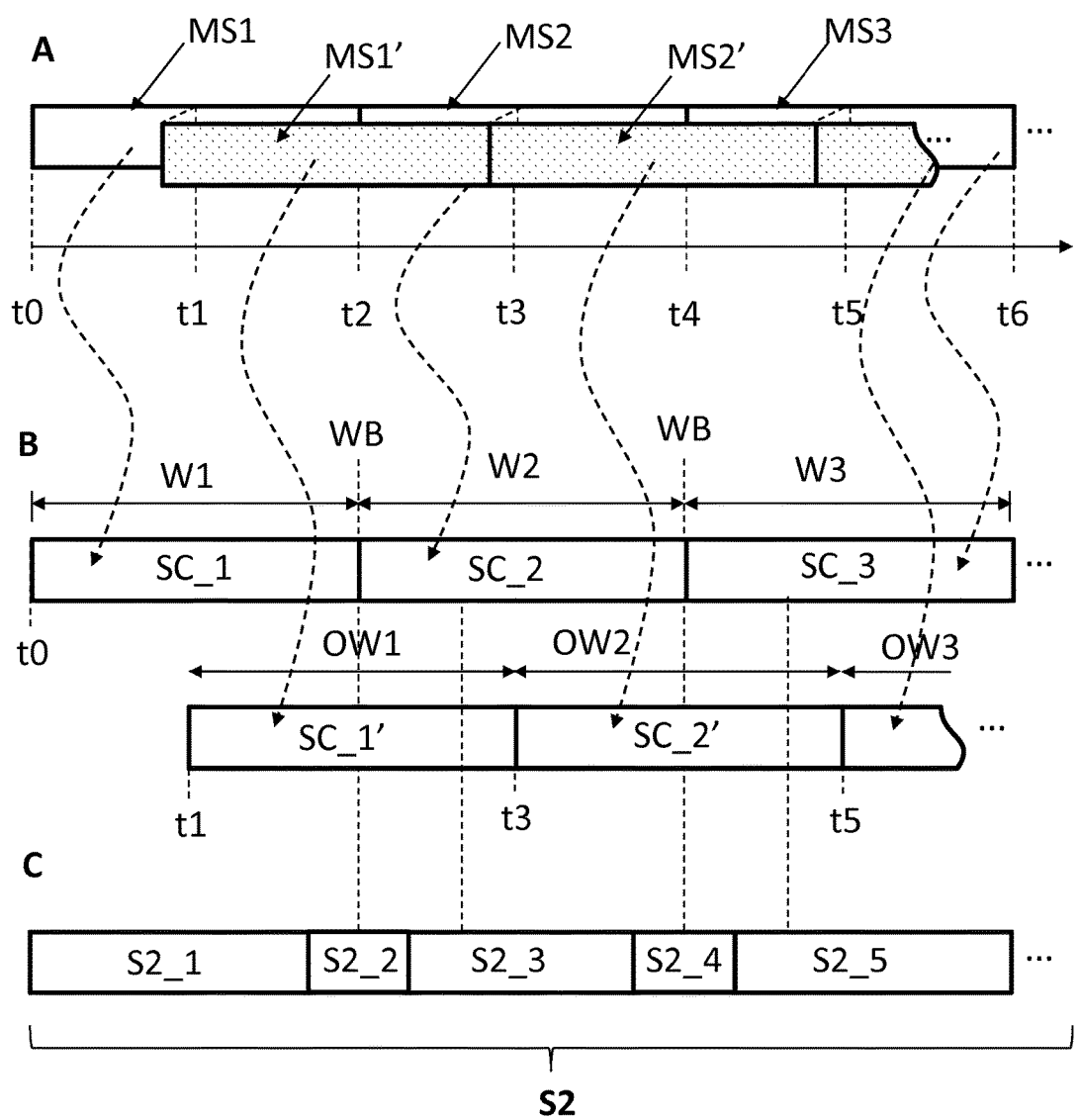
FIG. 2 shows a first example method for calculating a reconstructed signal using measurement and reconstruction windows according to the present description.

FIG. 2 shows a first example method for calculating or reconstructing an approximation of the original sensed signal using reconstruction windows according to the present description. According to an example embodiment, the signal reconstruction module 30 is configured to receive the CS-sampled signal S1 and calculate with that information the reconstructed signal S2. According to an embodiment, the signal reconstruction module 30 is configured to receive a number M of samples of the CS-sampled signal S1, calculate a number N of sparse coefficients using a reconstruction algorithm (e.g. BPDN, OMP, NIHT, etc.) and obtain a number of N values of the reconstructed signal S2 by applying a linear transform to said calculated N sparse coefficients. This process may be iteratively done for each window of M samples received, which may be referred to as a measurement window. The corresponding window of N sparse coefficients may be referred to as a reconstruction window. Therefore, for each measurement window of M samples of the CS-sampled signal S1, the signal reconstruction module 30 is able to calculate a reconstruction window of N samples/coefficients, and from that reconstruction window, a window of N values of the reconstructed signal S2. According to an example embodiment, the linear transform applied to the N sparse coefficients is a Gabor transform. According to another example embodiment, the linear transform is a Discrete Cosine Transform (DCT).

According to an example embodiment, and as shown in FIG. 2, the signal reconstruction module 30 is configured to receive and allocate a first group of measurement windows MS1 to MSi, each comprising a number M of samples, and to calculate, from said first group of measurement windows, a first plurality or group of reconstruction windows W1 to Wi, each comprising a number N of sparse coefficients SC_i. Also according to an example embodiment, the signal reconstruction module 30 is configured to receive and allocate a second group of measurement windows c, each comprising a number M of samples, and to calculate, from said second group of measurement windows, a second plurality or group of reconstruction windows OW1 to OWi, each comprising a number N of sparse coefficients SC_i'.

According to an embodiment, the first and second group of measurement windows are allocated so that each measurement window of the second group MS1' to MSi' contains a certain number of samples that overlap with two subsequent measurement windows of the first group MS1 to MSi. For example, the measurement samples of the first measurement window MS1 of the first group contains M samples received in a first time period, e.g. from time t0 to time t2, while the measurement samples of the first measurement window MS1' of the second group contains M samples received in a second time period, e.g. from time t1 to time t3, then the measurement samples of the second measurement window MS2 of the first group contains M samples received in a third time period, e.g. from time t2 to time t4, and so on. Therefore, the content/samples of the second group of measurement windows MS1' to MSi' overlaps, depending on the selected overlapping time periods, with the content of the first group of measurement windows MS1 to MSi. In other words, according to an example embodiment, the signal reconstruction module 30 is configured to receive samples and allocate those samples to measurement windows according to an overlapping sliding window approach, so that some windows overlap with the content of two other windows.

According to an example embodiment, the measurement windows of the first and second group have the same sample size M and time period length. According to an example embodiment, the measurement windows of the second group MS1' to MSi' are allocated to start at time points, e.g. t1, t3 and t5, which are delayed with respect to the allocation of the starting points, e.g. t0, t2 and t4, of the measurement windows of the first group MS1 to MSi. According to an example embodiment, said delay is half the value of the measurement window sample size M/2 or half the time period length of the measurement windows.

According to an example embodiment, the signal reconstruction module 30 is configured for allocating the samples of the measurement windows of the first and second group in an alternative manner, that is, first allocating the samples of the first widow MS1 of the first group, then allocating the samples of the first window MS1' of the second group, then allocating the samples of the second widow MS2 of the first group, then allocating the samples of the second window MS2' of the second group, and so on.

In the same sense, and according to an example embodiment, the resulting reconstruction windows of the second group OW1 to OWi may be an overlapped version of the resulting reconstruction windows of the first group W1 to Wi, as shown in FIG. 2.

According to an example embodiment, the signal reconstruction module 30 is also configured for calculating the reconstruction windows of the first and second group in an alternative manner, that is, first calculating the first reconstruction window W1 of the first group, then calculating the first reconstruction window OW1 of the second group, then calculating the second reconstruction window W2 of the first group, then calculating the second reconstruction window OW2 of the second group, and so on.

According to an example embodiment, the reconstruction windows of the first and second group W1 to Wi and OW1 to OWi have the same sample size N and time period length. According to an example embodiment, the reconstruction windows of the second group OW1 to OWi are calculated to start at time points, e.g. t1, t3 and t5, which are delayed with respect to the calculated starting time points, e.g. t0, t2 and t4, of the reconstruction windows of the first group W1 to Wi. According to an example embodiment, said delay is half the value of the measurement window sample size N/2 or half the time period length of the reconstructed windows.

Figure 3:
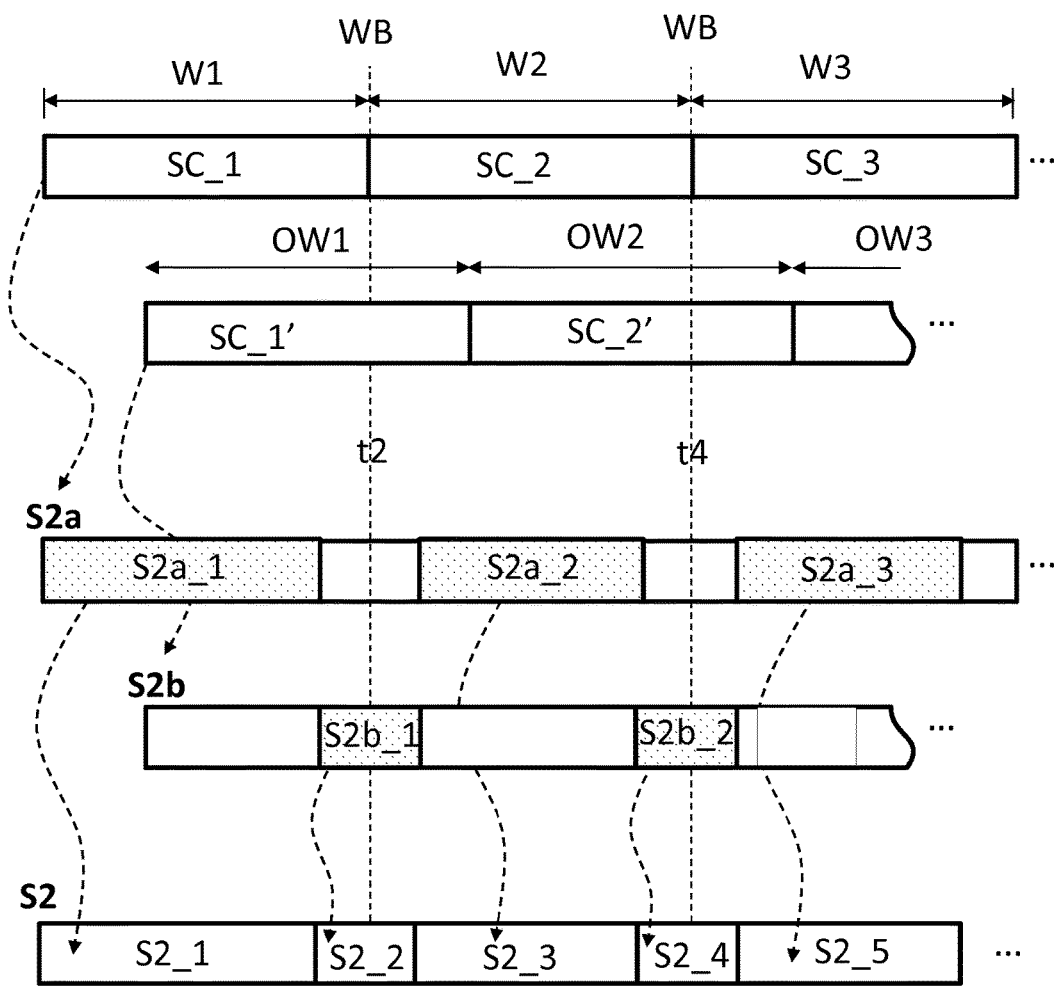
FIG. 3 shows a second example method for calculating a reconstructed signal derived from calculated first and second reconstruction signals according to the present description.

Also according to an example embodiment the signal reconstruction module 30 is configured for calculating the values S2_$n$ of the reconstructed signal S2, as shown in FIG. 2 and in more detail in FIG. 3.

As shown in FIG. 3, the signal reconstruction module 30 is configured for applying a linear transform to the reconstruction windows of the first group W1 to Wi in order to obtain a first reconstructed signal S2$a$, and applying a linear transform to the reconstruction windows of the second group OW1 to OWi in order to obtain a second reconstructed signal S2$b$. According to an example embodiment, the signal reconstruction module 30 is also configured for calculating the values S2_$n$ of the reconstructed signal S2 so that a first group of segments, e.g. S2_1, S2_3, S2_5 to S2_(2$n$+1), contain values derived from the first reconstructed signal S2$a$ and a second group of segments, e.g. S2_2, S2_4 to S2_2$n$, contain values derived from the second reconstructed signal S2$b$.

According to an example embodiment, the values S2_$n$ of the reconstructed signal S2 are the values from the first reconstructed signal S2$a$, but in which a certain number of values, e.g. values that lie close to a time point t2, t4 in which there is a window boundary WB of the first group of reconstruction windows W1 to Wi, are substituted by values, e.g. S2$b\_1$, S2$b\_2$, of the second reconstructed signal S2$b$ that lie close or adjacent to said window boundary WB time points t2, t4. According to an example embodiment, said number of substituted values that lie close or adjacent to a window boundary WB time point t2, t4 of the first group of reconstruction windows is N/2.

Figure 4:
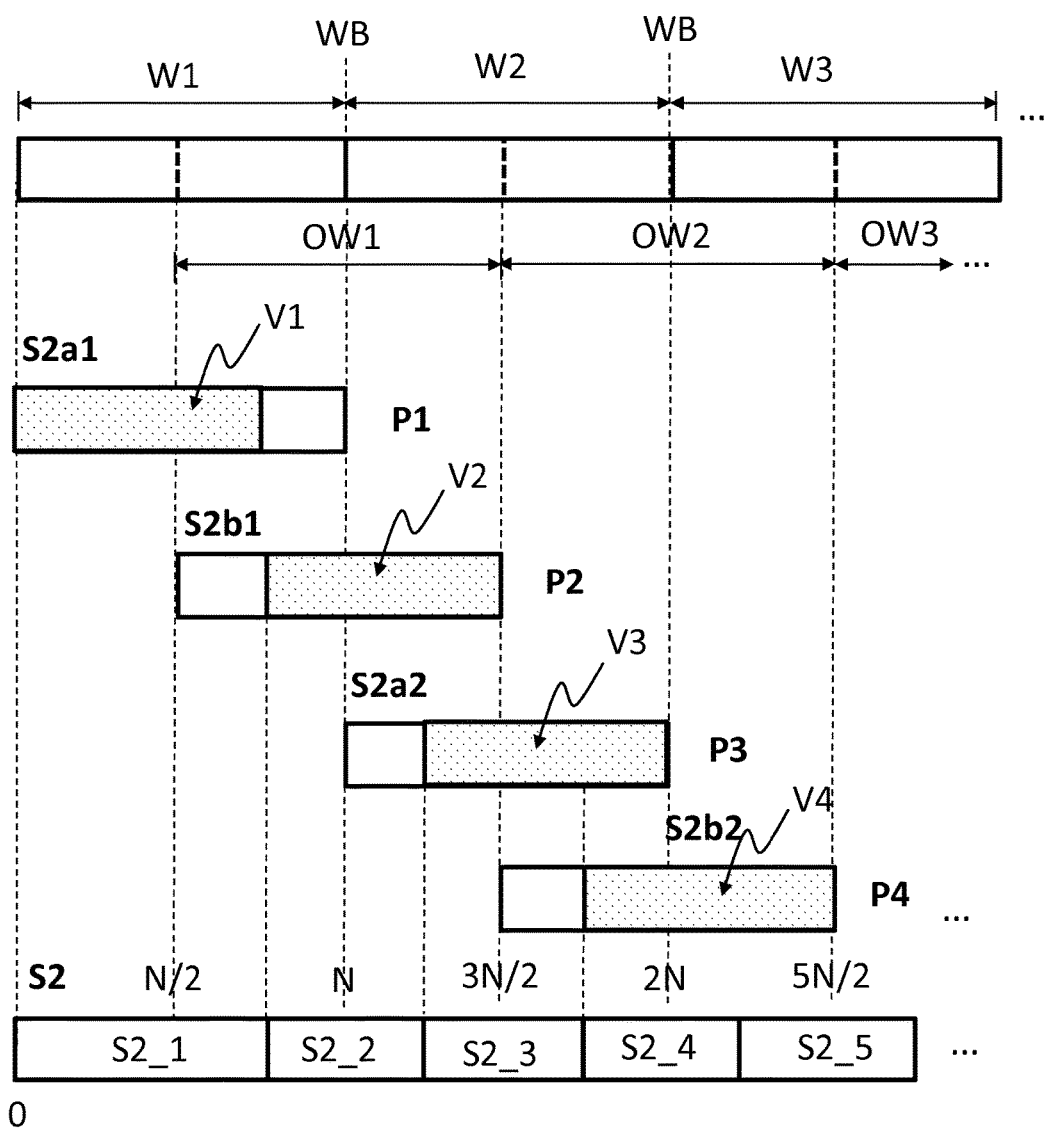
FIG. 4 shows a third example method for calculating a reconstructed signal derived from calculated first and second reconstruction signals according to the present description.

FIG. 4 shows schematically a method for generating the reconstructed signal S2 according to an example embodiment. At a first processing point P1, a first segment S2$a$1 of the reconstructed signal (derived from window W1 of the first group of reconstruction windows) is calculated, then at a second processing point P2, a second segment S2$b$1 of the reconstructed signal (derived from window OW1 of the second group of reconstruction windows) is calculated and a value/sample replacement process is performed so that only some values or samples V1 and V2 are kept, and the others are discarded; at a subsequent processing point P3 a third segment S2$a$2 of the reconstructed signal (derived from window W2 of the first group of reconstruction windows) is calculated and a further value replacement process is performed so that some of the values V2 of the second segment are substituted by values V3 of the third segment (or vice versa); at a subsequent processing point P4 a fourth segment S2$b$2 of the reconstructed signal (derived from window OW2 of the second group of reconstruction windows) is calculated and a further value replacement process is performed so that some of the values V3 of the third segment are substituted by values V4 of the fourth segment (or vice versa), and so on. Therefore, according to an example embodiment, the first reconstructed signal segment S2_1 contains values from the first calculated segment S2$a$1, the second reconstructed signal segment S2_2 contains values from the second calculated segment S2$b$1, the third reconstructed signal segment S2_3 contains values from the third calculated segment S2$a$2, the fourth reconstructed signal segment S2_4 contains values from the fourth calculated segment S2$b$2, and so on.

It is understood that the value replacement process at each processing point P1 to Pn may be done in different ways. According to an example embodiment, the value replacement process is done by: retaining N/2 samples from the previously reconstructed signal segment and replacing the first N/4 samples of the current reconstructed signal segment with the corresponding values from the previously reconstructed signal segment (samples from N/2 to 3N/4 of the previously reconstructed window).

According to an example embodiment, the proposed method for compressed sensing advantageously reduces latency, i.e. the time the system needs to provide information about the reconstructed signal, which depends on the amount of time taken from the moment the first measurement sample is acquired to the moment the first reconstructed signal sample is output. In conventional state of the art reconstruction schemes with non-overlapping windows, one needs to wait until M samples are acquired before the reconstruction process could be applied to generate N samples. Therefore if one needs to observe the 5N/4$^{th}$ sample with a reconstruction window size of N, one has to wait until 2M measurement samples are acquired, because the 5N/4$^{th}$ sample falls in the second reconstruction window. In contrast, when an overlapped window technique is applied according to an embodiment of the present description, the 5N/4$^{th}$ sample is available after acquiring only 3M/2 samples, due to the fact that the 5N/4$^{th}$ sample belongs to an overlapped window.

Figure 5:
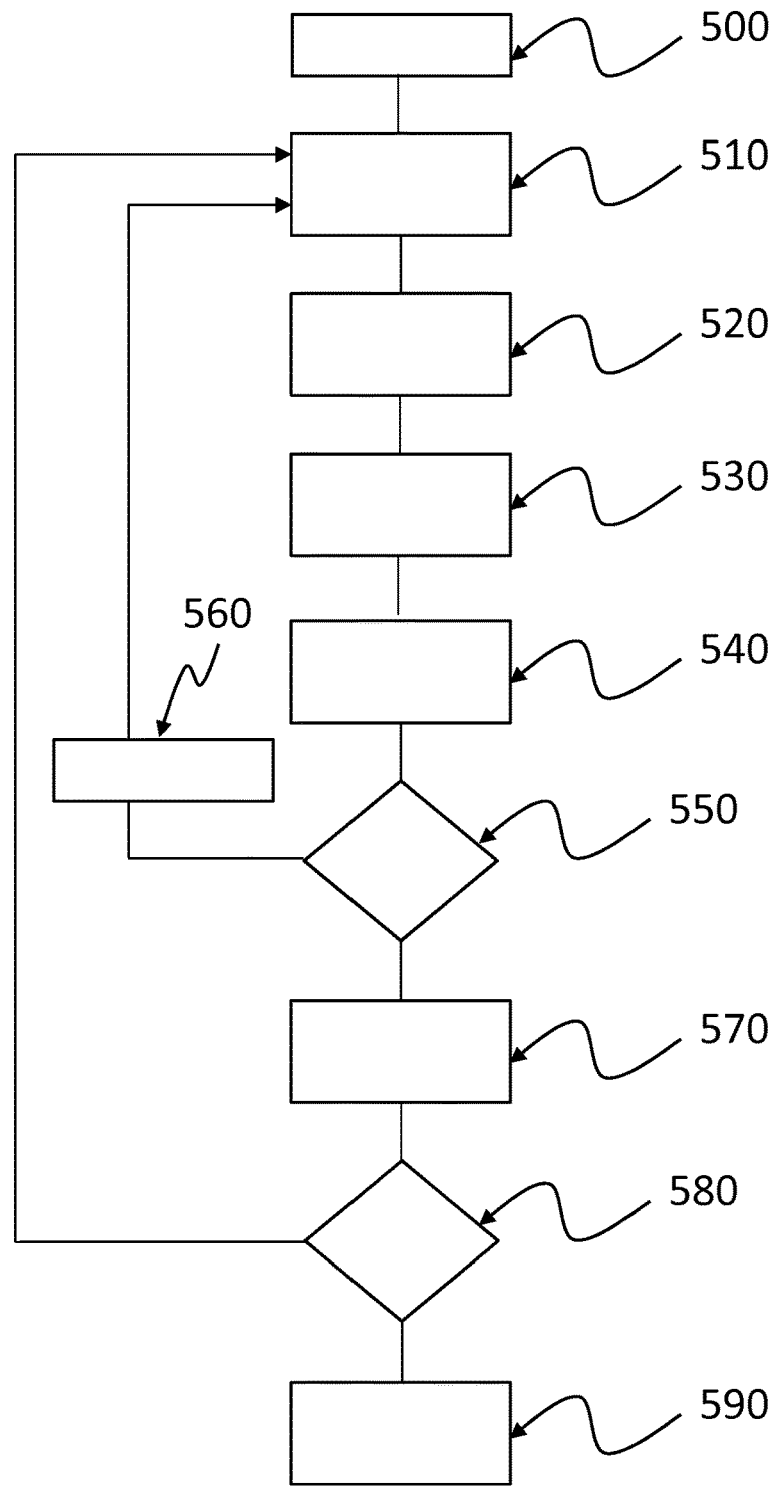
FIG. 5 shows a general flow diagram of an example method for calculating a reconstructed signal according to the present description.

FIG. 5 shows a general flow diagram of a method for calculating the reconstructed signal S2 according to an example embodiment. In a first step 500 an initialization parameter is set to true, e.g. 'first window' equals to 'true'. In a subsequent step 510 a measurement window MS1 to MSi or MS1' to MSi' is received and allocated according to embodiments of the present description and in connection with step 540; in a subsequent step 520 a corresponding reconstruction windows W1 to Wi or OW1 to OWi is calculated according to embodiments of the present description, e.g. using an inverse DCT; in a subsequent step 530 a corresponding first or a second version of the reconstructed signal S1$a$, S1$b$ is calculated according to embodiments of the present description; in a subsequent step 540 the measurement window is slid by a certain number of samples such that there is overlapping. According to an example embodiment the measurement window is slid by M/2 samples or half the size of the measurement windows; in a subsequent step 550 it is checked whether the initialization parameter is equal to 'true' and in that case the method goes to step 560 in which the initialization condition parameter is set to 'false' and then back to step 510 in order to receive and allocate a new measurement window; if the initialization condition is not met then the method follows with step 570 in which values from the previous reconstructed signal segment are substituted by values of the newly reconstructed signal segment, or vice versa (as for example shown in FIG. 4). According to an example embodiment, the replacement process is as follows: retain N/2 samples from the previously reconstructed signal window and replace the first N/4 samples of the current reconstructed signal window with the corresponding values from the previously reconstructed signal window (samples from N/2 to 3N/4 of the previously reconstructed window). In a subsequent step 580 it is checked whether there are more measurement samples to process and in that case the method goes to previous step 510; if no more measurement samples are available or there is an indication that the reconstruction process shall be finished, then the method finishes in step 590 providing the reconstructed signal S2.

According to a further example embodiment, the reconstruction method performs repeated $l_{1,2}$-minimization followed by inverse DCT based reconstruction on windows of window length N, with a N/2 sample shift between two consecutive reconstructions. Advantageously, according to an example embodiment, to overcome window boundary reconstruction artifacts, only the middle N/2 reconstructed samples are retained and combined with obtained samples from neighboring windows.

Advantageously, according to an embodiment, the reconstruction quality achieved with overlapping reconstruction windows of size N corresponds to the quality obtained using the traditional approach with windows of double the size 2N. Also advantageously, the proposed approach according to an example embodiment reduces the computational complexity of the reconstruction process, compared to a reconstruction window twice as long, by a factor of 2.

According to an example embodiment, the proposed algorithm advantageously circumvents the problem of poor reconstruction quality, particularly at the boundaries of the windows, at higher compression ratios for shorter windows, without having to resort of longer window sizes thereby reducing reconstruction complexity and latency.

Figure 6:
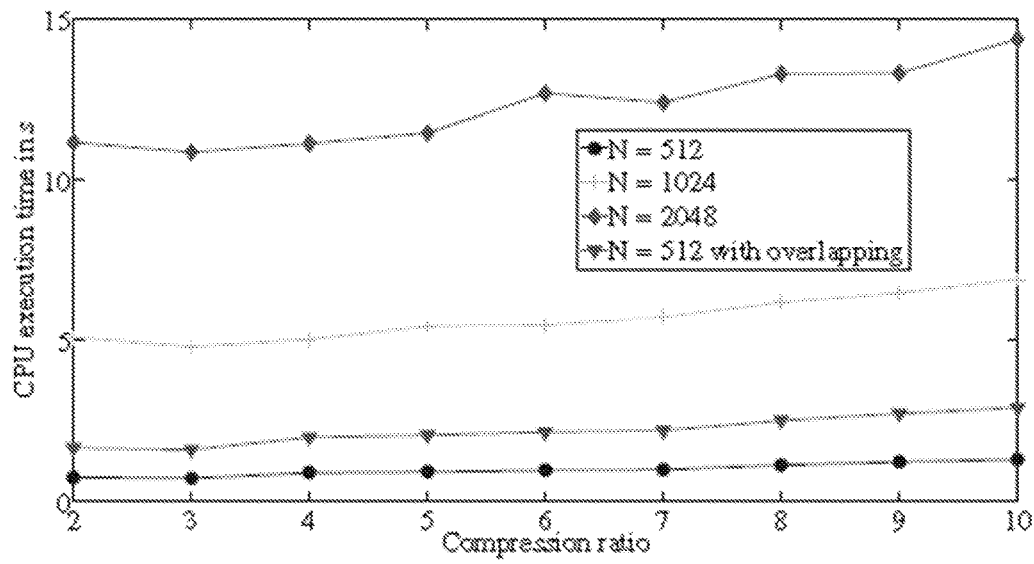
FIG. 6 shows a comparison graph of the CPU time required for the reconstruction of the original CS-sampled signal for different values of compression ratios and reconstruction window sizes, between a state of the art reconstruction algorithm and an example reconstruction algorithm implementing one of the methods according to the present description.

FIG. 6 shows a comparison graph of the CPU time required for the reconstruction of an original signal, e.g. a photoplethysmogram (PPG) signal, for different values of CS compression ratios and reconstruction window sizes, between a state of the art reconstruction algorithm and an example reconstruction algorithm, using DCT as sparsifying basis for reconstruction, implementing one of the methods according to the present description (N=512 with overlapping). To compare the complexity of the algorithms, the CPU time required for the execution of the algorithms implemented in MATLAB is measured. This CPU time is measured as the execution time of the algorithm for a given record over 25 runs for different values of compression ratio CR and window sizes along with execution time for the proposed algorithm according to an example embodiment of the present description (for a window size of 512 samples). The average execution time across 20 records is plotted.

Figure 7:
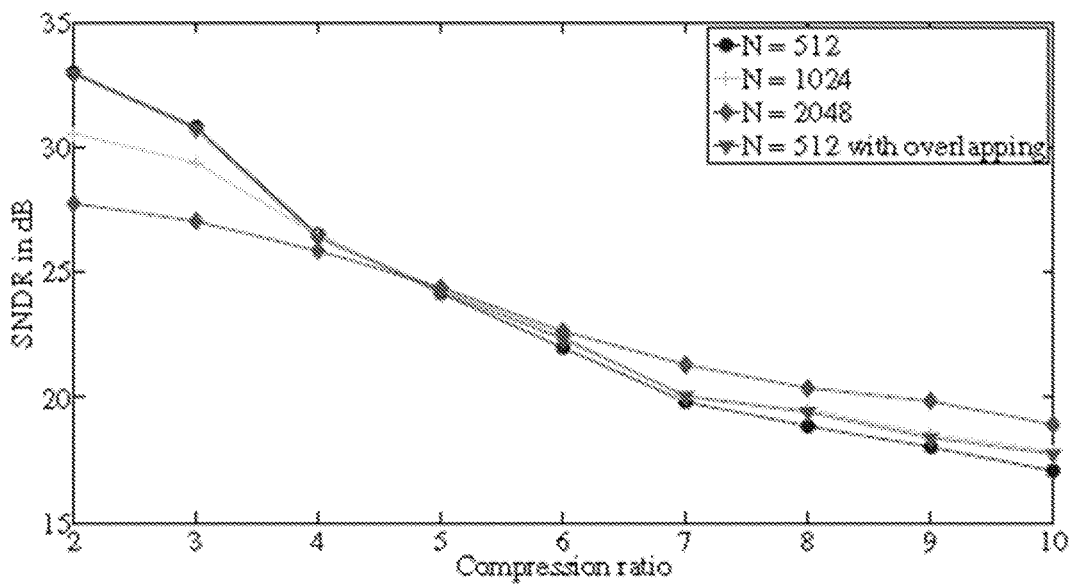
FIG. 7 shows a comparison graph of the Signal to Noise and Distortion ratio (SNDR) indicating the quality of the original CS-sampled signal reconstruction for different values of compression ratios and reconstruction window sizes, between a state of the art reconstruction algorithm and an example reconstruction algorithm implementing one of the methods according to the present description.

FIG. 7 shows a comparison graph of the Signal to Noise and Distortion ratio (SNDR) indicating the quality of the original signal reconstruction, e.g. a PPG signal, for different values of compression ratios and reconstruction window sizes, between a state of the art reconstruction algorithm and an example reconstruction algorithm, using DCT as sparsifying basis for reconstruction, implementing one of the methods according to the present description (N=512 with overlapping). At lower CS compression ratios, the average SNDR is higher for shorter windows. This is due to the presence of motion artifacts in the signal records which tend to reduce the sparsity when longer windows are used. As can be seen, the reconstruction accuracy of the proposed algorithm according to an example embodiment of the present description approaches that of a traditional reconstruction technique with longer reconstruction windows but with a significantly reduced CPU execution time at higher compression ratios.

FIG. 8 shows a comparison table of the CPU time required for the reconstruction of an original signal, e.g. a PPG signal, and the Signal to Noise and Distortion ratio (SNDR) indicating the quality of the original signal reconstruction for a CS compression ratio of 10 and different reconstruction window sizes, between a state of the art reconstruction algorithm and an example reconstruction algorithm (Overlapped Window), using DCT as sparsifying basis for reconstruction, implementing one of the methods according to the present description. For a compression ratio of 10, the CPU execution time, the average SNDR and the SNDR in the overlapped segments for the traditional reconstruction with window sizes 512 and 1024 and the proposed approach with window size 512 are shown. It can be seen that the CPU execution time and hence the complexity of the reconstruction is reduced by a factor of 2.4, without significant degradation in reconstruction accuracy.

Table 1 provides a more detailed implementation of an example algorithm for reconstructing a signal S2 in a compressed sensing system according to an example embodiment of the present description.

TABLE 1

Overlapped window reconstruction algorithm example

Definition:

Y : Measurement vector obtained by random sampling
$X_r$ : Reconstructed signal vector
$Y_{ovl}$ : Overlapped measurement vector
$\Psi$ : DCT basis matrix
$\Phi$ : Random sampling matrix
N : Length of the signal window
CR : Compression ratio
numWin : Total number of windows to be reconstructed
Algorithm:

TABLE 1-continued

Overlapped window reconstruction algorithm example procedure csDecode (Y, $\Phi$, $\Psi^{-1}$)
Compute S by solving min $1/2\|Y - \Phi\Psi^{-1}S\|_2^2 + \tau\|S\|_1$
Compute $X = \Psi^{-1} S$
return X
end procedure
loop for all i = 1 : numWin
1. $X_r^i \leftarrow$ csDecode($Y^i$, $\Phi$, $\Psi^{-1}$)
2. $X_r^{i+1} \leftarrow$ csDecode($Y^{i+1}$, $\Phi$, $\Psi^{-1}$ )

3. $Y_{ovl}\left(1:\dfrac{N}{2CR}\right) \leftarrow Y^i\left(\dfrac{N}{2CR}:\dfrac{N}{CR}\right)$ 4. $Y_{ovl}\left(\dfrac{N}{2CR}:\dfrac{N}{CR}\right) \leftarrow Y^{i+1}\left(1:\dfrac{N}{2CR}\right)$ 5. $X_{rovl} \leftarrow$ csDecode($Y_{ovl}$, $\Phi$, $\Psi^{-1}$ )

6. $X_r^i\left(\dfrac{3N}{4}:N\right) \leftarrow X_{rovl}\left(\dfrac{N}{4}:\dfrac{N}{2}\right)$ 7. $X_r^{i+1}\left(1:\dfrac{N}{4}\right) \leftarrow X_{rovl}\left(\dfrac{N}{2}:\dfrac{3N}{4}\right)$ end loop It will be clear for a person skilled in the art that the methods and techniques of the embodiments herein described may be implemented by hardware and/or software means in a processing unit and/or executed by a computer or processor, for example carrying out the steps of the methods according to example embodiments of the present description. They also may take the form of a program or computer executable code or instructions stored in a computer-readable medium or computer readable memory, such us, but not limited to a hard drive, ROM, RAM, CD-ROM, etc.

What is claimed is:

1. An electronic system with a processor, the electronic system comprising:
    a sensor configured to generate an original signal;
    a hardware-based compressive sampling module configured to provide samples of the original signal; and
    a hardware-based signal reconstruction module configured to carry out operations that reduce reconstruction artifacts at boundaries of allocated windows during reconstruction of the original signal from samples provided by the hardware-based compressive sampling module, the operations comprising:
    allocating a first window, a second window, and a third window each comprising respective samples of the original signal provided by the hardware-based compressive sampling module, wherein the first window spans a first time period that ends at a window-boundary time, wherein the second window spans a second time period that begins at the window-boundary time, and wherein the third window spans a third time period that partially overlaps the first and the second time periods and includes the window-boundary time;
    based on respective samples of the first and second windows, generating a first reconstruction of the original signal that includes a first set of values associated with the first and second time periods;
    based on respective samples of the third window, generating a second reconstruction of the original signal that includes a second set of values associated with the third time period; and based on the first and second reconstructions, generating a final reconstruction of the original signal containing (i) values of the second set associated with a particular time segment that includes the window-boundary time and (ii) values of the first set associated with one or more time segments other than the particular time segment.

2. The electronic system of claim 1, wherein generating the final reconstruction comprises replacing, in the first reconstruction, (i) values of the first set that correspond to the particular time segment with (ii) values of the second set that are associated with the particular time segment.

3. The electronic system of claim 1, wherein generating the final reconstruction comprises at least:
at a first processing point corresponding to the window-boundary time, determining values of the first set that are associated with the first time period; and
at a second processing point corresponding to an end of the third time period, (i) determining values of the second set, (ii) retaining values of the first set that are associated with times that precede a start of the particular time segment, and (iii) retaining values of the second set that are associated with times that follow the start of the particular time segment.

4. The electronic system of claim 3, wherein generating the final reconstruction further comprises:
at a third processing point corresponding to an end of the second time period, (i) determining values of the first set that are associated with the second time period, (ii) discarding values of the second set that are associated with times that follow an end of the particular time segment, and (iii) retaining values of the first set associated with times that follow the end of the particular time segment.

5. The electronic system of claim 1, wherein generating the first reconstruction comprises (i) determining first sparse coefficients by applying a reconstruction algorithm to respective samples in the first and second windows and (ii) determining the first set of values by applying a linear transform to the first sparse coefficients, and wherein generating the second reconstruction comprises (i) determining second sparse coefficients by applying the reconstruction algorithm to respective samples in the third window and (ii) determining the second set of values by applying the linear transform to the second sparse coefficients.

6. The electronic system of claim 1, wherein the original signal is an ECG, EEG, EMG, or a PPG biosignal.

7. The electronic system of claim 1, wherein the hardware-based compressive sampling module is configured to sample the original signal at a rate below a Nyquist sampling rate of the original signal.

8. The electronic system of claim 1, wherein generating the final reconstruction of the original signal comprises combining (i) the values of the second set associated with a particular time segment that includes the window-boundary time and (ii) the values of the first set associated with one or more time segments other than the particular time segment to reduce reconstruction artifacts in the particular time segment of the final reconstruction.

9. An electronic device comprising an electronic system with a processor, the electronic system comprising:
a sensor configured to generate an original signal;
a hardware-based compressive sampling module configured to provide samples of the original signal; and
a hardware-based signal reconstruction module configured to carry out operations that reduce reconstruction artifacts at boundaries of allocated windows during reconstruction of the original signal from samples provided by the hardware-based compressive sampling module, the operations comprising:
allocating a first window, a second window, and a third window each comprising respective samples of the original signal provided by the hardware-based compressive sampling module, wherein the first window spans a first time period that ends at a window-boundary time, wherein the second window spans a second time period that begins at the window-boundary time, and wherein the third window spans a third time period that partially overlaps the first and the second time periods and includes the window-boundary time;
based on respective samples of the first and second windows, generating a first reconstruction of the original signal that includes a first set of values associated with the first and second time periods;
based on respective samples of the third window, generating a second reconstruction of the original signal that includes a second set of values associated with the third time period; and
based on the first and second reconstructions, generating a final reconstruction of the original signal containing (i) values of the second set associated with a particular time segment that includes the window-boundary time and (ii) values of the first set associated with one or more time segments other than the particular time segment.

10. The electronic device of claim 9, wherein generating the final reconstruction comprises replacing, in the first reconstruction, (i) values of the first set that correspond to the particular time segment with (ii) values of the second set that are associated with the particular time segment.

11. The electronic device of claim 9, wherein generating the final reconstruction comprises at least:
at a first processing point corresponding to the window-boundary time, determining values of the first set that are associated with the first time period; and
at a second processing point corresponding to an end of the third time period, (i) determining values of the second set, (ii) retaining values of the first set that are associated with times that precede a start of the particular time segment, and (iii) retaining values of the second set that are associated with times that follow the start of the particular time segment.

12. The electronic device of claim 11, wherein generating the final reconstruction further comprises:
at a third processing point corresponding to an end of the second time period, (i) determining values of the first set that are associated with the second time period, (ii) discarding values of the second set that are associated with times that follow an end of the particular time segment, and (iii) retaining values of the first set associated with times that follow the end of the particular time segment.

13. The electronic device of claim 9, wherein generating the first reconstruction comprises (i) determining first sparse coefficients by applying a reconstruction algorithm to respective samples in the first and second windows and (ii) determining the first set of values by applying a linear transform to the first sparse coefficients, and wherein generating the second reconstruction comprises (i) determining second sparse coefficients by applying the reconstruction algorithm to respective samples in the third window and (ii) determining the second set of values by applying the linear transform to the second sparse coefficients.

14. The electronic device of claim 9, wherein the original signal is an ECG, EEG, EMG, or a PPG biosignal.

15. A method for reducing reconstruction artifacts at boundaries of allocated windows during reconstruction of an original signal from samples in a compressed-sensing system with a hardware-based signal reconstruction module, the method comprising:
- allocating, by the hardware-based signal reconstruction module, a first window, a second window, and a third window each comprising respective samples of the original signal, wherein the original signal is generated by a sensor, wherein the original signal is sampled at a rate below a Nyquist sampling rate of the original signal, wherein the first window spans a first time period that ends at a window-boundary time, wherein the second window spans a second time period that begins at the window-boundary time, and wherein the third window spans a third time period that partially overlaps the first and the second time periods and includes the window-boundary time;
- based on respective samples of the first and second windows, generating, by the hardware-based signal reconstruction module, a first reconstruction of the original signal that includes a first set of values associated with the first and second time periods;
- based on respective samples of the third window, generating, by the hardware-based signal reconstruction module, a second reconstruction of the original signal that includes a second set of values associated with the third time period; and
- based on the first and second reconstructions, generating, by the hardware-based signal reconstruction module, a final reconstruction of the original signal containing (i) values of the second set associated with a particular time segment that includes the window-boundary time and (ii) values of the first set associated with one or more time segments other than the particular time segment.

16. The method of claim 15, wherein the third time period partially overlapping the first and the second time periods causes the third window to include (i) one or more samples of the original signal that are also included in the first window and (ii) one or more samples of the original signal that are also included in the second window.

17. The method of claim 15, wherein generating the final reconstruction comprises replacing, in the first reconstruction, (i) values of the first set that correspond to the particular time segment with (ii) values of the second set that are associated with the particular time segment.

18. The method of claim 15, wherein generating the final reconstruction comprises:
- at a first processing point corresponding to the window-boundary time, determining values of the first set that are associated with the first time period;
- at a second processing point corresponding to an end of the third time period, (i) determining values of the second set, (ii) retaining values of the first set that are associated with times that precede a start of the particular time segment, and (iii) retaining values of the second set that are associated with times that follow the start of the particular time segment; and
- at a third processing point corresponding to an end of the second time period, (i) determining values of the first set that are associated with the second time period, (ii) discarding values of the second set that are associated with times that follow an end of the particular time segment, and (iii) retaining values of the first set associated with times that follow the end of the particular time segment.

19. The method of claim 15, wherein generating the first reconstruction comprises (i) determining first sparse coefficients by applying a reconstruction algorithm to respective samples in the first and second windows and (ii) determining the first set of values by applying a linear transform to the first sparse coefficients, and wherein generating the second reconstruction comprises (i) determining second sparse coefficients by applying the reconstruction algorithm to respective samples in the third window and (ii) determining the second set of values by applying the linear transform to the second sparse coefficients.

20. The method of claim 15, wherein the first, second, and third time periods are each a same time period length.

* * * * *